United States Patent
Peterson et al.

(10) Patent No.: US 9,859,888 B2
(45) Date of Patent: Jan. 2, 2018

(54) TRANSMITTER WITH FEEDBACK TERMINATED PREEMPHASIS

(71) Applicant: QUALCOMM Incorporated, San Diego, CA (US)

(72) Inventors: LuVerne Ray Peterson, San Diego, CA (US); Thomas Bryan, Carlsbad, CA (US); Stephen Thilenius, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/174,842

(22) Filed: Jun. 6, 2016

(65) Prior Publication Data

US 2017/0353185 A1 Dec. 7, 2017

(51) Int. Cl.
| | |
|---|---|
| *H03B 1/00* | (2006.01) |
| *H03K 3/00* | (2006.01) |
| *H03K 19/00* | (2006.01) |
| *H04B 1/04* | (2006.01) |
| *H03K 17/687* | (2006.01) |

(52) U.S. Cl.
CPC ..... *H03K 19/0013* (2013.01); *H03K 17/6871* (2013.01); *H04B 1/04* (2013.01)

(58) Field of Classification Search
CPC . H03K 119/0013; H03K 17/6871; H04B 1/04
USPC .................................. 327/108–112
See application file for complete search history.

(56) References Cited

U.S. PATENT DOCUMENTS

| | | | |
|---|---|---|---|
| 5,498,989 | A | 3/1996 | Diba |
| 6,005,413 | A * | 12/1999 | Schmitt ............ H03K 19/00315 |
| | | | 326/58 |
| 6,025,738 | A | 2/2000 | Masleid |
| 6,060,906 | A | 5/2000 | Chow et al. |
| 6,281,706 | B1 | 8/2001 | Wert et al. |
| 6,351,172 | B1 | 2/2002 | Ouyang et al. |
| 7,142,018 | B2 | 11/2006 | Masleid et al. |
| 7,639,045 | B2 | 12/2009 | Motamed et al. |
| 7,859,314 | B2 | 12/2010 | Rutkowski et al. |
| 9,407,263 | B2 * | 8/2016 | Hoefler ............... H03K 19/0013 |
| 9,461,624 | B2 * | 10/2016 | Ravula Lakshmi ... H03K 3/011 |

FOREIGN PATENT DOCUMENTS

| | | |
|---|---|---|
| JP | H02196519 A | 8/1990 |
| JP | 3667447 B2 | 7/2005 |

OTHER PUBLICATIONS

International Search Report and Written Opinion—PCT/US2017/028669—ISA/EPO—dated Jul. 21, 2017.

* cited by examiner

*Primary Examiner* — Lincoln Donovan
*Assistant Examiner* — Diana J Cheng
(74) *Attorney, Agent, or Firm* — Haynes and Boone, LLP

(57) ABSTRACT

A transmitter is disclosed with a pull-up feedback circuit and a feedback circuit. The transmitter includes an output driver for driving an output terminal.

20 Claims, 4 Drawing Sheets

TRANSMITTER WITH FEEDBACK TERMINATED PREEMPHASIS

TECHNICAL FIELD

This application relates generally a transmitter, and more particularly to a transmitter with feedback terminated preemphasis.

BACKGROUND

Due to its simplicity, the usage of binary signaling to transmit data from one integrated circuit to another is virtually universal. Depending upon the binary value of the bit being transmitted, a transmitting integrated circuit either charges its output terminal to a positive signaling voltage or to ground. The output terminal couples over a transmission line to an input terminal at the receiving integrated circuit. The receiving integrated circuit determines whether its input terminal was charged or discharged to determine the binary value of the received bit.

Although binary signaling is advantageously simple to implement, the transmitting integrated circuit must not only charge its output terminal but also the transmission line coupling it to the input terminal on the receiving device. If the transmission line is relatively short, its capacitance may not be too significant. But as the transmission line length grows, the capacitance rises with it. The power consumption of cycling such a capacitive load between the positive signaling voltage and ground may thus become prohibitive, particularly for mobile devices that must conserve battery charge.

The power consumption is not only a function of the transmission line capacitance but also depends on the magnitude of the positive signaling voltage. For example, it is conventional to use a power supply voltage as the positive signaling voltage. Assuming that a positive logic convention is used, the transmission of a binary one bit thus requires the transmission line to be charged "full rail" to the power supply voltage. To reduce the associated power consumption, it is known to configure the transmitter such that it does not use the power supply voltage as the positive signaling voltage but instead uses some lower voltage value. For example, it is known to use an NMOS pull-up transistor having a current source connected to its source. The current source interacts with the NMOS pull-up transistor so that the positive signaling voltage is the power supply voltage minus the threshold voltage for the NMOS pull-up transistor. Although this lowers the output voltage swing, it comes at the expense of the power dissipated by the current source.

Accordingly, there is a need in the art for low-power transmitters having an output voltage swing that is lower than the power supply voltage.

SUMMARY

A transmitter is provided with an output driver that drives an output data signal over an output terminal responsive to an input data signal on a bit-by-bit basis. Each bit for the input data signal extends over a corresponding bit period (unit interval). If the input data signal is in a first binary state, the output driver discharges the output terminal for the unit interval to transmit a bit in the first binary state for the output data signal. Conversely, if the input data signal is in a second binary state (complement of the first binary state), the output driver charges the output terminal to a positive signaling voltage that equals a power supply voltage for the transmitter minus a transistor threshold voltage to transmit a bit in the second binary state for the output data signal.

The transmitter is located in a transmitting integrated circuit. The output terminal couples over a transmission line to an input terminal for a receiving integrated circuit. The output driver must thus charge the transmission line to the positive signaling voltage when transmitting an output data signal bit in the second binary state. Depending upon the length of the transmission line (for example, a printed circuit board trace or lead), it may have a significant capacitance such that charging the transmission line consumes power. The transmitter thus advantageously conserves power compared to "full rail" transmitters that charge the transmission line to the transmitter power supply voltage.

Although the transmitter thus conserves power, the "pull-up" for the output driver is weakened with regard to driving the output data signal in the second binary state as compared to a conventional transmitter that charges the transmission line to the transmitter power supply voltage. The output driver could thus potentially fail to charge the transmission line to the positive signaling voltage prior to the conclusion of the unit interval at higher data rates. To maintain low power operation without reduced operating speed, the transmitter includes a pull-up switch that is controlled by a feedback circuit. The feedback circuit responds to the input data signal transitioning from the first binary value to the second binary value by closing the pull-up switch to couple the output terminal to a power supply node supplying the transmitter power supply voltage. The pull-up switch thus provides a strong pull-up compared to the output driver. To prevent this strong pull-up from driving the transmission line above the positive signaling voltage, the feedback circuit resets or switches off the pull-up switch in response to the output terminal voltage rising from ground to a threshold voltage that is lower than the positive signaling voltage. In this fashion, the preemphasis from the feedback circuit and the pull-up switch advantageously provides a strong pull-up when the input data signal transitions from the first binary value to the second binary value while limiting the output terminal voltage to the positive signaling voltage.

These and additional advantages may be better appreciated through the following detailed description.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1A:
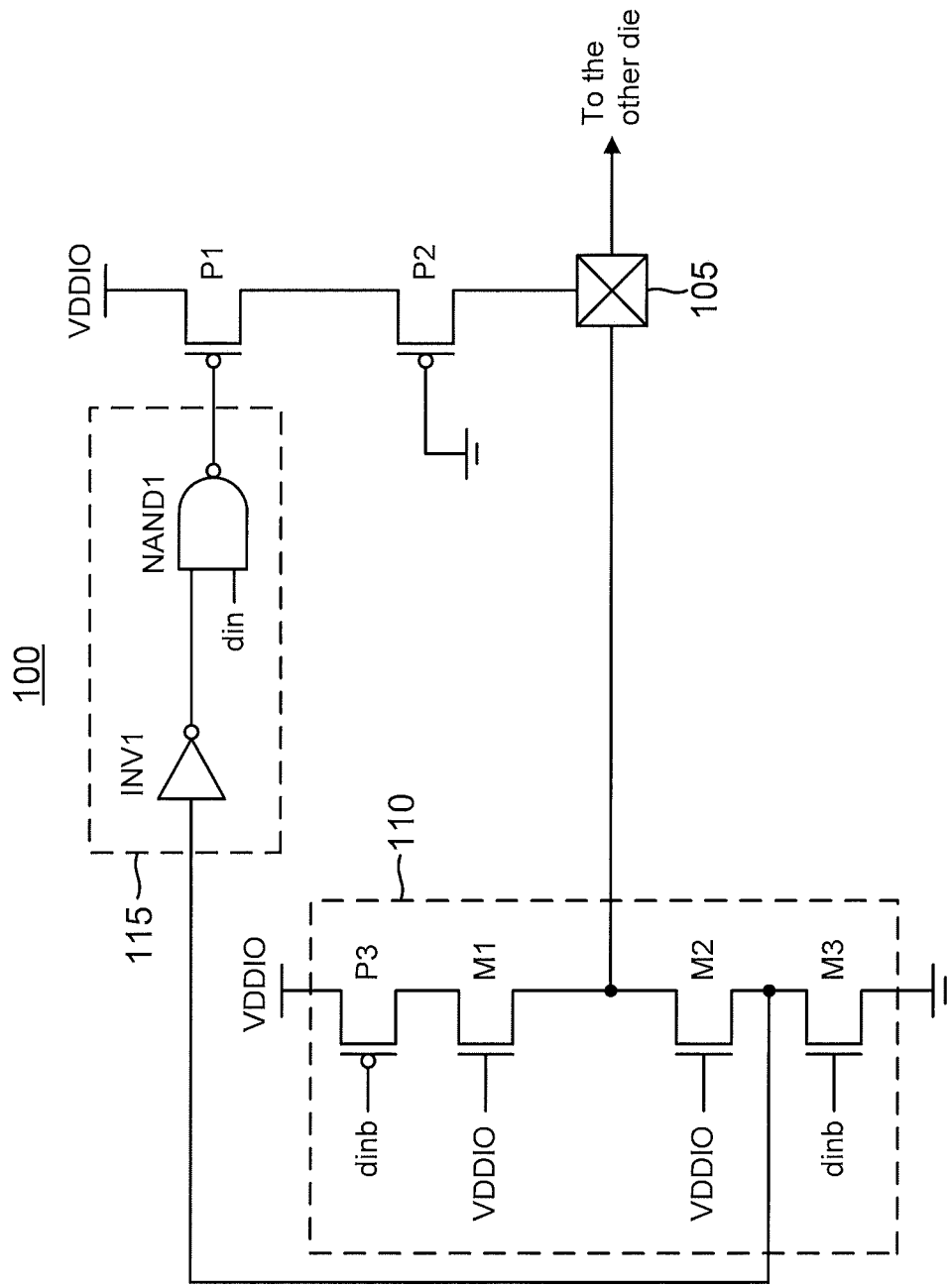
FIG. 1A is a circuit diagram of a data transmitter in accordance with an aspect of the disclosure.

An integrated circuit single-ended transmitter is disclosed that includes an output driver for driving a binary output signal over an output terminal to a receive terminal for a receiving integrated circuit. The output driver drives an output data signal to a positive signaling voltage responsive to an input data signal being charged to a transmitter power supply voltage. The positive signaling voltage is less than the transmitter power supply voltage by a transistor threshold voltage such that the output driver weakly charges the output terminal as compared to a conventional pull-up in which the transmitter would charge the output terminal to the transmitter power supply voltage. The resulting weak pull-up by the output driver saves power with regard to the charging of a transmission line that couples from the output terminal to the receive pin on the receiving integrated circuit. Depending upon its length and electrical characteristics, the transmission line may have a relatively large amount of capacitance such that weakly charging the transmission line to the positive signaling voltage as compared to the transmitter power supply voltage conserves charge and thus extends battery life for the transmitting integrated circuit (in battery-powered embodiments).

The weak pull-up from the output driver may be problematic, however, at greater data rates. Each bit for the input data signal and corresponding bit for the output data signal extends over a bit period (unit interval). As the data rate increases, the unit interval decreases such that the weak pull-up of the transmission line may not charge it properly to the positive signaling voltage prior to the end of a given unit interval. The transmitter thus includes a pull-up switch controlled by a feedback circuit for strongly charging (strong pull-up) the output terminal in response to the input data signal transitioning from ground to the transmitter power supply voltage. The feedback circuit responds to this binary transition for the input data signal by closing the pull-up switch, which couples between the output terminal and a power supply node supplying the transmitter power supply voltage. Such a strong pull-up quickly charges the output terminal to enhance high-speed operation but will overcharge the output terminal higher than the positive signaling voltage if the pull-up switch remained closed for the duration of the unit interval. The feedback circuit thus resets and switches off the pull-up switch in response to the output terminal voltage rising from ground to a threshold voltage that is greater than 0 V but less than the positive signaling voltage. In this fashion, a strong pull-up is provided for an initial portion of the unit interval following a binary high transition of the input data signal such that the output signal is driven above the positive signaling voltage in this initial portion but then declines to the positive signaling voltage in a remaining portion of the unit interval to maintain the power savings of the reduced level for the positive signaling voltage as compared to the transmitter power supply voltage. In general, the temporary boosting of the output terminal voltage boosts it above the positive signaling voltage without rising to the transmitter power supply voltage (VDDIO).

Some example transmitters will now be discussed. Turning now to the drawings, a transmitter 100 is shown in FIG. 1A. An output driver 110 includes a serial chain of transistors beginning with a PMOS transistor P3 have a source coupled to a power supply node supplying the transmitter power supply voltage (VDDIO). A complement (dinb) of the data input signal (din) for transmitter 100 drives the gate of transistor P3. The drain of transistor P3 couples to a drain of an NMOS transistor M1 that has its gate driven by VDDIO. The source of transistor M1 acts as an output node for output driver 110 and couples to an output terminal 105.

The following discussion will assume that a positive logic convention is implemented in transmitter 100 such that a binary one value for the input data signal corresponds to a VDDIO voltage level whereas a binary zero value is represented by ground. But it will be appreciated that the advantageous preemphasis disclosed herein may also be practiced in a transmitter employing a negative logic convention in which a binary one bit is grounded and a binary zero bit is represented by positive voltage. If the input data signal is a logic high, the complement data input signal dinb will be grounded so as to switch on transistor P3 in output driver 110. But transistor P3 cannot strongly pull-up output terminal 105 to VDDIO since transistor M1 introduces a transistor threshold voltage drop at its source. The binary high value for the output data signal driven out over output terminal 105 by output driver 110 in response to the input data signal being a binary high value will thus be a positive signaling voltage equaling (VDDIO−Vt), where Vt is the threshold voltage for transistor M1.

Figure 1B:
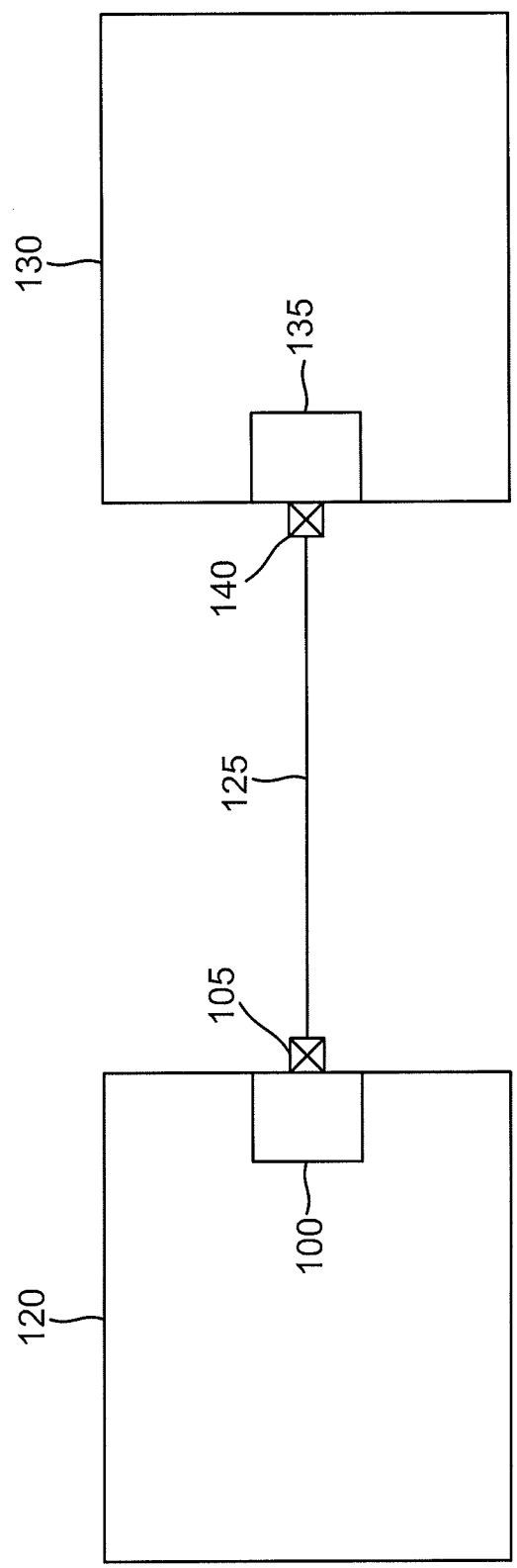
FIG. 1B illustrates a system including a transmitting integrated circuit with the transmitter of FIG. 1A and also a receiving integrated circuit.

The reduction in the positive signaling voltage for the output signal from VDDIO is quite advantageous as shown in FIG. 1B in that output terminal 105 couples over a transmission line 125 such as a printed circuit board trace to a receive pin or terminal 140 for a receiving integrated circuit 130 including a receiver 135. Transmitter 100 is located within a transmitting integrated circuit 120. The capacitance of transmission line 125 increases if its length is increased such that the capacitance may become significant. The reduction in positive signaling voltage from VDDIO thus conserves power for transmitter 100. Referring again to FIG. 1A, output driver 110 grounds output terminal (or pad) 105 through an NMOS transistor M2 and an NMOS transistor M3. The source of transistor M1 couples to the drain of transistor M2 whereas the gate of transistor M2 is driven by VDDIO. Transistor M2 is thus maintained in the conducting state. The drain of transistor M3 couples to the source of transistor M2. The source of transistor M3 couples to ground. Since the complement data input signal dinb drives the gate of transistor M3, transistor M3 will switch on when the data input signal is grounded (dinb being driven to VDDIO). Output terminal 105 will then be grounded through the switched on transistor M3 and the always-on transistor M2. Note that unlike the pull-up of output terminal 105, the discharge of output terminal 105 by output driver 110 is relatively strong. There may thus be no need for any binary zero preemphasis. It will be appreciated however, that such falling edge preemphasis for the output signal may be included in alternative embodiments.

Transmitter 100 may advantageously be constructed from thin-oxide transistors since no device is exposed to more than the transmitter power supply voltage VDDIO. Transistors P3, M1, M2, and M3 in output driver 110 may thus all comprise thin-oxide devices. In general, it is desirable for electrostatic discharge (ESD) purposes for any output node such as output terminal 105 that could be exposed to static discharge to couple to ground or to a power supply node through at least two serially-coupled thin-oxide transistors. Referring to output driver 110, one can appreciate that such an ESD rule is followed in that output terminal 105 couples to the power supply node for VDDIO through the serial combination of transistors M1 and P3. Similarly, output terminal 105 couples to ground through the serial combination of transistors M2 and M3. It will be appreciated, however, that transistor M2 may be omitted in alternative embodiments in which case transistor M3 may comprise a thick-oxide transistor for ESD robustness.

As discussed above, output driver 110 serves to charge output terminal 105 to the positive signaling voltage for the unit interval (and thus charges transmission line 125) when the data input signal is charged to VDDIO (a binary high value). Conversely, output driver 110 grounds output terminal 105 and transmission line 125 for the unit interval when the input data signal has a binary zero value. But the charging of output terminal 105 is fairly weak in that transistor P3 cannot charge output terminal 105 to VDDIO due to the threshold voltage drop across transistor M1. As the capacitance of transmission line 125 is increased and the unit interval decreased, output driver 110 may then fail to fully charge output terminal to the desired positive signaling voltage when driving a binary high output data signal in response to a binary high input data signal. Transmitter 100 thus includes a feedback circuit 115 that functions to switch on a pull-up switch such as a PMOS transistor P1 to couple output terminal 105 to the power supply node supplying VDDIO. In particular, feedback circuit 115 includes an inverter INV1 having an input coupled to the drain of transistor M3 (and also the source of transistor M2). When the input data signal is a binary zero, output driver 110 discharges output terminal 105 and thus causes the output of inverter INV 1 to go high to the power supply voltage VDDIO (inverter INV1 being powered by the power supply voltage VDDIO). Feedback circuit 115 also includes a NAND gate NAND1 that functions to NAND the output of inverter INV1 with the data input signal (din). Should the input data signal din transition from a binary zero to a binary one value, the output of NAND gate NAND1 will go low to ground since the operation of NANDing two binary one inputs produces a binary zero output. This low output then switches on pull-up transistor P1 because the output of NAND gate NAND1 couples to the gate of pull-up transistor P1. The pull-up transistor P1 will thus be switched on at the beginning of the unit interval for the data input signal din when the data input signal din transitions from a binary zero to a binary one value. The drain of pull-up transistor P1 will then begin strongly charging towards VDDIO since the source of pull-up transistor P1 couples to the VDDIO power supply node. The drain of pull-up transistor P1 couples to output terminal 105 through an always-on PMOS transistor P2 for ESD purposes. As discussed with regard to transistor M2, transistor P2 may be omitted in alternative embodiments in which pull-up transistor P1 comprises a thick-oxide transistor for robustness to ESD. Regardless of whether transistor P2 is included or not, neither it nor pull-up transistor P1 introduce a threshold voltage drop at their drains such that output terminal 105 is strongly charged from ground towards VDDIO.

To prevent this strong pull-up from charging output terminal significantly above the desired positive signaling voltage, feedback circuit 115 functions to switch off pull-up transistor P1 when the drain of transistor M3 rises above a threshold voltage for the NMOS transistor (not illustrated) within inverter INV1. In that regard, note that output driver 110 acts as inverter to the complement data input signal dinb through the action of PMOS transistor P3 and NMOS transistor M3. An analogous pair of a PMOS transistor and an NMOS transistor form inverter INV1. When the drain of transistor M3 rises above the threshold voltage for the NMOS transistor in inverter INV1, this NMOS transistor switches on to pull the output of inverter INV1 to ground. In response, the output of NAND gate NAND1 goes high to the power supply voltage VDDIO so as to switch off pull-up transistor P1. The threshold voltage for the NMOS transistor in inverter INV1 is less than (or equal to) the positive signaling voltage such that the feedback through feedback circuit 115 prevents pull-up transistor P1 from significantly overcharging output terminal 105 over the desired positive signaling voltage.

Figure 2:
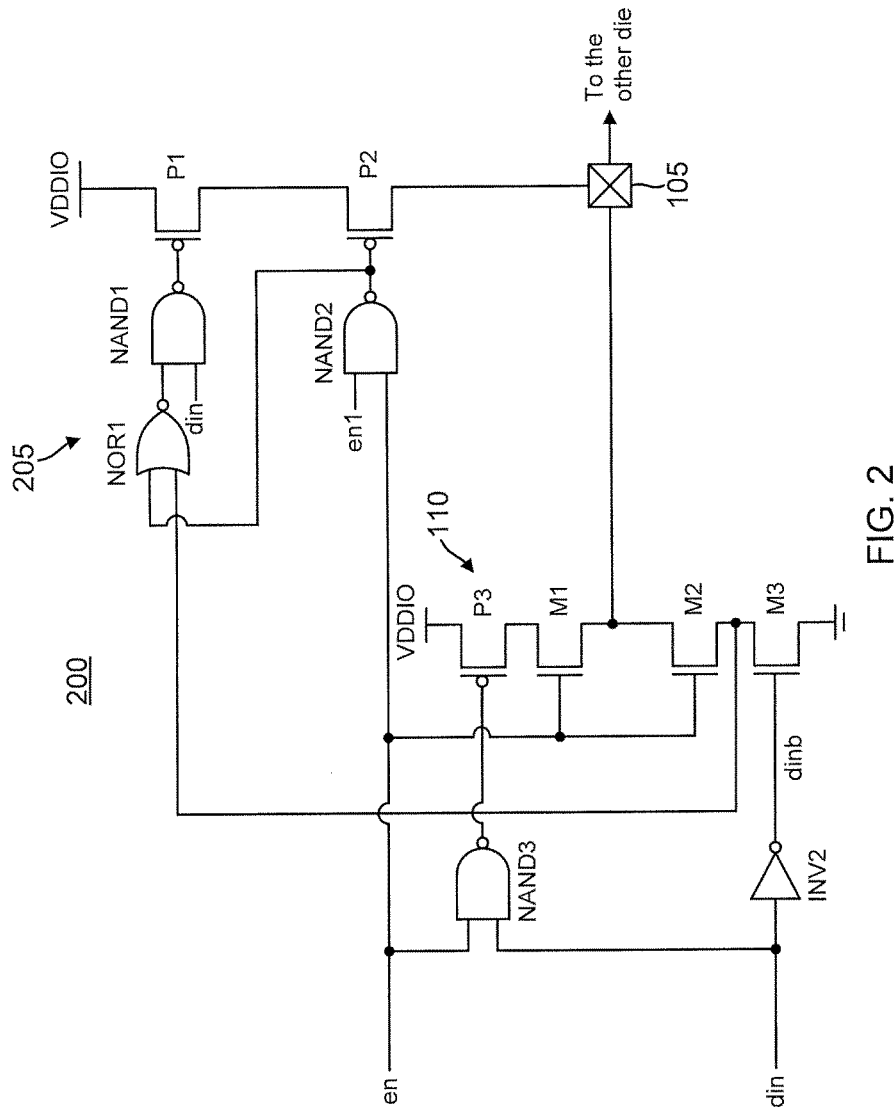
FIG. 2 is a circuit diagram of a data transmitter in accordance with an aspect of the disclosure.

Referring again to FIG. 1B, note that a manufacturer of transmitting integrated circuit 120 may have no control over how a user integrates such an integrated circuit into a system. The length of transmission line 125 may be such that its capacitance is quite minor and no binary high preemphasis is necessary despite the weak pull-up from output driver 110. Conversely, the length of transmission line 125 in another system may be relatively long such that a binary high preemphasis is critical. A transmitter 200 shown in FIG. 2 is thus configured to respond to a preemphasis enable signal en1 with regard to selectively enabling or disabling the action of pull-up transistor P1 and a feedback circuit 205. Output driver 110 includes transistors P3, M1, M2, and M3 as discussed with regard to transmitter 100. The data input signal din is inverted by an inverter INV2 to produce the complement data input signal dinb that drives the gate of transistor M3. The data input signal din is received by a NAND gate NAND3 that also receives a transmitter enable signal en. Transmitter signal en controls whether transmitter 200 responds to the data input signal din. During active operation, the transmitter enable signal en is driven to the binary high value (VDDIO) such that NAND gate NAND3 acts as an inverter to output the complement data input signal dinb. The output of NAND gate NAND3 drives the gate of transistor P3 so that this transistor functions as discussed with regard to transmitter 100 while the transmitter enable signal en is maintained high. Should the transmitter enable signal en be discharged low, the output of NAND gate NAND3 is maintained high such that output terminal 105 is never charged high while transmitter enable signal en is low.

The transmitter enable signal en also drives the gates of transistors M1 and M2 such that these transistors function as discussed with regard to transmitter 100 while the transmitter enable signal en is charged to the power supply voltage VDDIO (maintained as a binary high signal). The transmitter enable signal en is received by a NAND gate NAND2 that also receives the preemphasis enable signal en1. NAND gate NAND2 thus functions as an inverter with regard to the preemphasis enable signal en1 while the transmitter enable signal en is maintained high. The output of NAND gate NAND2 will thus be grounded when both the transmitter enable signal en and the preemphasis enable signal en1 are asserted high. The output of NAND gate NAND2 drives the gate of PMOS transistor P2 such that this transistor functions as discussed with regard to transmitter 100 while both the transmitter enable signal en and the preemphasis enable signal en1 are high (charged to VDDIO).

A feedback circuit 205 includes a NOR gate NOR1 that receives the output of NAND gate NAND2 and the feedback node voltage (the drain of transistor M3). NOR gate NOR1 thus functions as discussed with regard to inverter INV1 while preemphasis enable signal en1 is asserted high. Feedback circuit 205 is analogous to feedback circuit 115 in that feedback circuit 205 similarly includes NAND gate NAND1 that receives the data input signal din and also receives the inversion of the feedback node voltage while the preemphasis signal en is enabled. The output of NAND gate NAND1 drives the gate of pull-up transistor P1, which functions as discussed with regard to transmitter 100. Transmitter 200 thus includes a binary high preemphasis capability that is selectively enabled through the binary state of preemphasis enable signal en1.

Figure 3:
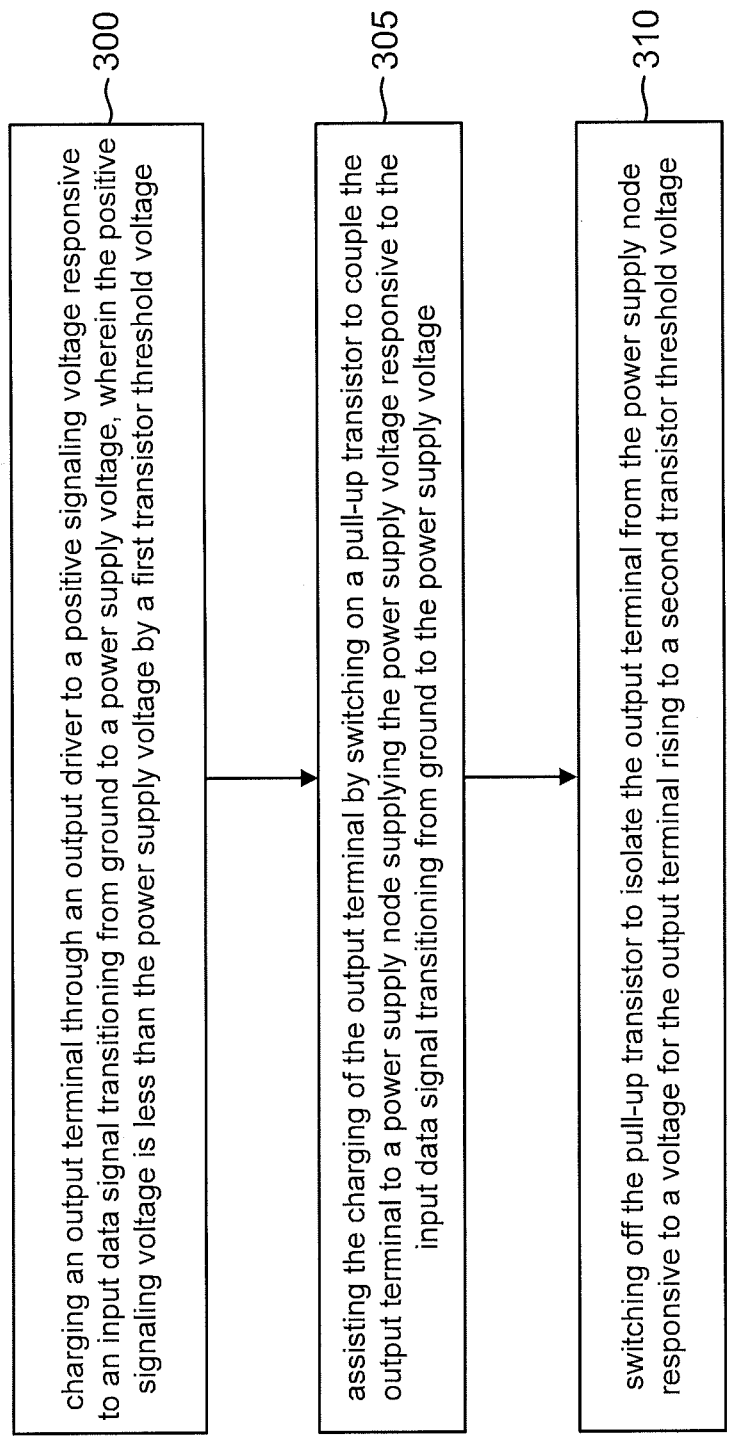
FIG. 3 is a flowchart for a method of operation for a transmitter in accordance with an aspect of the disclosure.

An example method of operation for a data transmitter with binary high preemphasis will now be discussed with regard to the flowchart of FIG. 3. The method includes an act 300 of charging an output terminal through an output driver to a positive signaling voltage responsive to an input data signal transitioning from ground to a power supply voltage, wherein the positive signaling voltage is less than the power supply voltage by a first transistor threshold voltage. An example of act 300 is the switching on of transistor P3 in output driver 110 responsive to the input signal data din being charged to VDDIO from ground. Transistor M1 then introduces a threshold voltage at its drain to charge output terminal 105 to the positive signaling voltage The method also includes an act 305 of assisting the charging of the output terminal by switching on a pull-up transistor to couple the output terminal to a power supply node supplying the power supply voltage responsive to the input data signal transitioning from ground to the power supply voltage. The switching on of pull-up transistor P1 by feedback circuit 115 or 205 is an example of act 305.

Finally, the method includes an act 310 of switching off the pull-up transistor to isolate the output terminal from the power supply node responsive to a voltage for the output terminal rising to a second transistor threshold voltage. The switching off of pull-up transistor P1 by feedback circuit 115 or 205 is an example of act 310. Note that the feedback node voltage (the voltage of the source of transistor M2 or the drain of transistor M3) is essentially equal to the output terminal voltage while the output terminal voltage is relatively low. Transistor M2 will only introduce a threshold drop between its source and drain as the output terminal voltage rises above the positive signaling voltage (assuming the threshold voltages for transistors M1 and M2 are the same). But the threshold voltage for the NMOS transistor in inverter INV1 (or the equivalent in NOR gate NOR1) is lower than the positive signaling voltage. Thus, the output terminal voltage and the feedback voltage are equivalents of each other with regard to switching off pull-up transistor P1.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A transmitter, comprising:
   an output terminal;
   an output driver configured to charge the output terminal to a positive signaling voltage in response to an input data signal being charged to a transmitter power supply voltage and to discharge the output terminal in response to the input data signal being grounded, wherein the positive signaling voltage is less than the transmitter power supply voltage by a first transistor threshold voltage;
   a pull-up switch coupled between the output terminal and a power supply node configured to supply the transmitter power supply voltage; and
   a feedback circuit configured to switch the pull-up switch on responsive to the input data signal transitioning from ground to the transmitter power supply voltage, wherein the feedback circuit is further configured to switch off the pull-up switch responsive to a voltage for the output terminal charging to a second transistor threshold voltage that is less than the positive signaling voltage.

2. The transmitter of claim 1, wherein the output driver comprises:
   a first PMOS transistor having a source coupled to the power supply node and a gate coupled to an complement input data node configured to supply a complement of the input data signal; and
   a first NMOS transistor having a source coupled to the output terminal and a drain coupled to a drain for the first PMOS transistor, wherein a gate for the first NMOS transistor is charged to the transmitter power supply voltage, and wherein the first transistor threshold voltage is a threshold voltage for the first NMOS transistor.

3. The transmitter of claim 1, wherein the output driver comprises:
   a first NMOS transistor having a source coupled to ground and a gate coupled to a complement input data node configured to supply a complement of the input data signal; and
   a second NMOS transistor having a source coupled to a drain for the first NMOS transistor and a drain coupled to the output terminal, wherein a gate for the second transistor is charged to the transmitter power supply voltage.

4. The transmitter of claim 3, wherein the feedback circuit includes an inverter having an input coupled to the source of the second NMOS transistor.

5. The transmitter of claim 4, wherein the feedback circuit further includes a logic gate configured to process an output of the inverter and the data input signal, and wherein an output of the logic gate controls the pull-up switch.

6. The transmitter of claim 5, wherein the logic gate comprises a NAND gate.

7. The transmitter of claim 4, further comprising:
   a first NAND gate configured to process a transmitter enable signal and a preemphasis enable signal; and
   a first PMOS transistor coupled between the output terminal and the pull-up switch, wherein an output of the first NAND gate couples to a gate of the first PMOS transistor, and wherein the inverter comprises a NOR gate having a first input coupled to the output of the first NAND gate and having a second input coupled to the source of the second NMOS transistor.

8. The transmitter of claim 7, wherein the pull-up switch comprises a second PMOS transistor having a source coupled to the power supply node and a drain coupled to a source of the first PMOS transistor.

9. The transmitter of claim 7, further comprising:
   a second NAND gate configured to receive the transmitter enable signal and the data input signal, wherein the output driver further comprises:
   a second PMOS transistor having a source coupled to the power supply node and having a gate coupled to an output of the second NAND gate; and
   a third NMOS transistor having a drain coupled to a drain of the second PMOS transistor and having a source coupled to the output terminal, the third NMOS transistor having a gate configured to be driven by the transmitter enable signal.

10. The transmitter of claim 9, wherein the transmitter is integrated into a transmitting integrated circuit.

11. A method for transmitting, comprising:
    charging an output terminal through an output driver to a positive signaling voltage responsive to an input data signal transitioning from ground to a power supply voltage, wherein the positive signaling voltage is less than the power supply voltage by a first transistor threshold voltage;

assisting the charging of the output terminal by switching on a pull-up transistor to couple the output terminal to a power supply node supplying the power supply voltage responsive to the input data signal transitioning from ground to the power supply voltage; and switching off the pull-up transistor to isolate the output terminal from the power supply node responsive to a voltage for the output terminal rising to a second transistor threshold voltage that is less than the positive signaling voltage.

12. The method of claim 11, further comprising selectively enabling the assisting of the charging of the output terminal based upon a capacitance for a transmission line coupled to the output terminal.

13. The method of claim 12, wherein the selectively enabling of the assisting is responsive to a preemphasis enable signal.

14. The method of claim 11, further comprising selectively enabling the charging of the output terminal responsive to a transmitter enable signal.

15. The method of claim 11, further comprising:
discharging the output terminal to ground responsive to the input data signal transitioning to ground.

16. The method of claim 15, wherein discharging the output terminal to ground comprises switching on an NMOS transistor responsive to a complement of the data input signal being charged to the transmitter power supply voltage.

17. The method of claim 16, wherein switching off the pull-up transistor is responsive to a drain voltage of the NMOS transistor exceeding the second transistor threshold voltage.

18. A transmitter, comprising:
an output terminal;
an output driver configured to charge the output terminal to a positive signaling voltage while an input data is charged to a transmitter power supply voltage and to discharge the output terminal while an input data signal is grounded, wherein the positive signaling voltage is less than transmitter power supply voltage by a first transistor threshold voltage; and means for coupling the output terminal to a power supply node configured to supply the transmitter power supply voltage responsive to the input data signal transitioning from ground to the transmitter power supply voltage and for isolating the output terminal from the power supply node responsive to a voltage for the output terminal charging to a second transistor threshold voltage that is less than the positive signaling voltage.

19. The transmitter of claim 18, wherein the output driver comprises:
a first PMOS transistor having a source coupled to the power supply node and a gate coupled to an complement input data node configured to supply a complement of the input data signal;
a first NMOS transistor having a source coupled to the output terminal and a drain coupled to a drain for the first PMOS transistor, wherein a gate for the first NMOS transistor is charged to the transmitter power supply voltage, and wherein the first transistor threshold voltage is a threshold voltage for the first NMOS transistor;
a second NMOS transistor having a source coupled to ground and a gate coupled to the complement input data node; and
a third NMOS transistor having a source coupled to a drain for the second NMOS transistor and a drain coupled to the output terminal, wherein a gate for the third NMOS transistor is charged to the transmitter power supply voltage.

20. The transmitter of claim 19, wherein the means is configured to monitor a voltage of the source of the third NMOS transistor to determine whether the output terminal voltage charges to the second transistor threshold voltage.

* * * * *